United States Patent
Azuma

(10) Patent No.: US 7,253,692 B2
(45) Date of Patent: Aug. 7, 2007

(54) PHASE LOCKED LOOP

(75) Inventor: Eiji Azuma, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 10 days.

(21) Appl. No.: 11/179,643

(22) Filed: Jul. 13, 2005

(65) Prior Publication Data

US 2006/0012440 A1    Jan. 19, 2006

(30) Foreign Application Priority Data

Jul. 16, 2004    (JP) .............................. 2004-209292

(51) Int. Cl.
*H03L 7/00*    (2006.01)

(52) U.S. Cl. ............... 331/16; 331/1 A; 331/34; 331/177 R; 331/179

(58) Field of Classification Search ............... 331/1 A, 331/16, 34, 177 R, 179
See application file for complete search history.

(56) References Cited

U.S. PATENT DOCUMENTS 6,927,716 B2 *    8/2005    Keaveney et al. .......... 341/143

FOREIGN PATENT DOCUMENTS

JP        2002-16494    1/2002

* cited by examiner

*Primary Examiner*—Arnold Kinkead
(74) *Attorney, Agent, or Firm*—Westerman, Hattori, Daniels & Adrian, LLP.

(57) ABSTRACT

The invention is directed to a phase locked loop. The phase locked loop comprises a variable frequency divider for performing a fraction frequency division by switching a dividing value having an integer portion and a fraction portion; a memory for storing the fraction portion; and a data converter for adding the integer portion to the fraction portion from the memory based on a clock signal from the variable frequency divider to determine the dividing value to be supplied to the variable frequency divider.

12 Claims, 6 Drawing Sheets

FIG. 3A

| COUNT NUMBER L/A | 1 | 2 | 3 | 4 | 5 | 6 | 7 | 8 | 9 | 10 |
|---|---|---|---|---|---|---|---|---|---|---|
| 0/10 | 0 | 0 | 0 | 0 | 0 | 0 | 0 | 0 | 0 | 0 |
| 1/10 | 0 | 0 | 0 | 0 | 0 | 0 | 0 | 0 | 0 | 1 |
| 2/10 | 0 | 0 | 0 | 0 | 0 | 0 | 0 | 0 | 1 | 1 |
| 3/10 | 0 | 0 | 0 | 0 | 0 | 0 | 0 | 1 | 1 | 1 |
| 4/10 | 0 | 0 | 0 | 0 | 0 | 0 | 1 | 1 | 1 | 1 |
| 5/10 | 0 | 0 | 0 | 0 | 0 | 1 | 1 | 1 | 1 | 1 |
| 6/10 | 0 | 0 | 0 | 0 | 1 | 1 | 1 | 1 | 1 | 1 |
| 7/10 | 0 | 0 | 0 | 1 | 1 | 1 | 1 | 1 | 1 | 1 |
| 8/10 | 0 | 0 | 1 | 1 | 1 | 1 | 1 | 1 | 1 | 1 |
| 9/10 | 0 | 1 | 1 | 1 | 1 | 1 | 1 | 1 | 1 | 1 |

FIG. 3B

| COUNT NUMBER L/A | 1 | 2 | 3 | 4 | 5 | 6 | 7 | 8 | 9 | 10 |
|---|---|---|---|---|---|---|---|---|---|---|
| 1/10 | 0 | 0 | 0 | 0 | 0 | 0 | 0 | 0 | 0 | 1 |

FIG. 3C

DATA CONVERSION

| 5+L/A | 5 | 5 | 5 | 5 | 5 | 5 | 5 | 5 | 5 | 6 |
|---|---|---|---|---|---|---|---|---|---|---|

FIG. 5A

| COUNT NUMBER | 1 | 2 | 3 | 4 | 5 | 6 | 7 | 8 | 9 | 10 | 11 | 12 | 13 | 14 | 15 | 16 | 17 | 18 | 19 | 20 | AVERAGE DIVIDING VALUE |
|---|---|---|---|---|---|---|---|---|---|---|---|---|---|---|---|---|---|---|---|---|---|
| DIVIDING VALUE | 0 | 1 | 0 | 0 | 0 | 1 | 1 | −1 | 0 | 2 | −2 | 3 | −2 | 2 | −1 | 0 | 2 | 0 | −1 | 1 | 0.3 |

DATA CONVERSION ⇒

FIG. 5B

INTEGER PORTION(N) = 5

| COUNT NUMBER | 1 | 2 | 3 | 4 | 5 | 6 | 7 | 8 | 9 | 10 | 11 | 12 | 13 | 14 | 15 | 16 | 17 | 18 | 19 | 20 | AVERAGE DIVIDING VALUE |
|---|---|---|---|---|---|---|---|---|---|---|---|---|---|---|---|---|---|---|---|---|---|
| DIVIDING VALUE | 5 | 6 | 5 | 5 | 5 | 6 | 6 | 4 | 5 | 7 | 3 | 8 | 3 | 7 | 4 | 5 | 7 | 5 | 4 | 6 | 5.3 |

PHASE LOCKED LOOP

PRIORITY CLAIM

Priority is claimed on Japanese Patent Application No. 2004-209292, filed Jul. 16, 2004, the content of which is incorporated herein by reference.

BACKGROUND OF THE INVENTION

1. Field of the Invention

The invention relates to a phase locked loop that can obtain an output frequency of more precise frequency resolution than a reference frequency making use of a fraction frequency division, and relates particularly to a phase locked loop that includes a memory for storing a dividing value with a less capacity.

2. Description of Related Art

The phase locked loop (PLL) is generally meant by an electronic circuit in which a frequency of an output signal is made identical to that of an input signal or a reference frequency. When a dividing value is switched over to another one using this type of fraction division, noise is produced in switching the values.

In order to solve this noise problem, there has been proposed a noise shaping system. According to the noise shaping system, ΣΔ (sigma-delta) modulation is used to make the noise present in a broader frequency band, which moves unnecessary noise components to a higher frequency region than a signal band. The noise shaping system can quantize a signal producing almost no quantization error. As a document that discloses the phase locked loop employing the noise shaping system, Japanese Unexamined Publication No. 2002-16494 can be cited.

By the way, the phase locked loop of the prior art includes a method by which a dividing value is calculated whenever an output of a variable frequency divider varies, and a method by which a dividing value is read out for its use from a memory at the time of a frequency division after the dividing value is calculated and stored beforehand in the memory.

Referring to FIG. 6, an explanation is given below that is about a method for calculating a dividing value in advance described in the patent document above. In FIG. 6, a phase locked loop 10 contains an arithmetic circuit 1, a memory circuit 2, a variable frequency divider 3, an address generator 4, a phase comparator 5, a low pass filter (LPF) 6, and a voltage controlled oscillator 7. The memory circuit 2 stores dividing values using different addresses for necessary frequencies. The dividing values to be stored are represented as follows.

The dividing value=N+L/A, where N, L and A are an integer, N is an integer portion of the dividing value, L is a numerator of a fraction, and A is a denominator of the fraction.

Next, an operation of FIG. 6 will be explained. The arithmetic circuit 1 calculates a dividing value in advance according to an output frequency of the variable frequency divider 3, and outputs the dividing value to the memory circuit 2, which stores the dividing value from the arithmetic circuit 1. To the address generator 4 is input a signal from an input unit (not shown). Using this signal and a clock signal from the variable frequency divider 3, a reading-out address in the memory circuit 2 is specified.

The variable frequency divider 3 applies the clock signal to the phase comparator 5 which compares a reference frequency with the clock signal from the variable frequency divider 3. The LPF 6 eliminates higher frequency components of a signal from the phase comparator 5 to provide lower frequency components of the signal to the voltage controlled oscillator 7 which, in response to the voltage from the LPF 6, varies an oscillation frequency to be supplied to the variable frequency divider 3.

Incidentally, a dividing value to be stored in the memory circuit 2 is determined by the integer portion N and the fraction portion (L/A). With respect to the data needed as the dividing value, A data are required for one integer portion N. For example, when the integer portion N needs 32, 32 * A are necessary as the dividing value.

Under the situation, since the integer portion N is decided based on a variable scope of the output frequency, a short variable scope causes no problem.

However, since the variable scope of the output frequency of the variable frequency divider 3 of a phase locked loop that is used in a frequency synthesizer is wide, the integer portion N is large. Accordingly, the conventional system required the memory circuit 2 to have an immense capacity in order to store dividing values.

On the other hand, when a method of calculating a dividing value is adopted every time an output of the variable frequency divider varies, so as to solve the problem, another problem is caused that calculation time becomes longer.

SUMMARY OF THE INVENTION

An object of the invention is to provide a phase locked loop that requires a memory unit to have a small capacity to store dividing values.

In order to solve the problem, the invention is directed to a phase locked loop. One aspect of the invention relates to the phase locked loop that comprises a variable frequency divider for performing a fraction frequency division by switching a dividing value having an integer portion and a fraction portion; a memory for storing the fraction portion; and a data converter for adding the integer portion to the fraction portion from the memory based on a clock signal from the variable frequency divider to determine the dividing value to be supplied to the variable frequency divider.

Preferably, the memory has a read-out address designated therein based on a numerator portion input of the fraction portion and the clock signal.

Preferably, the memory stores the dividing value calculated based on calculation algorithm by ΣΔ (sigma-delta) modulation.

Preferably, the phase locked loop further comprises an address generator for specifying an address of the memory by the numerator portion input of the fraction portion and the clock signal.

Another aspect of the invention relates to a method of performing a fraction frequency division of a variable frequency divider of a phase locked loop. The method comprises switching a dividing value having an integer portion and a fraction portion; storing the fraction portion; and adding the integer portion to the fraction portion from the memory based on a clock signal from the variable frequency divider to determine the dividing value to be supplied to the variable frequency divider.

Preferably, the phase locked loop is applied to a frequency synthesizer.

The invention has the following advantages.

Since the memory stores only the fraction portion of the dividing value, the capacity of the memory can be made smaller. According to this, a small capacity of ROMs, which is built-in in a FPGA (Field Programmable Gate Array), can be used to realize a phase locked loop. In addition, because only an adder of simple structure enables calculation of a dividing value by a fraction frequency division, no arithmetic circuit is needed. Moreover, because switching a dividing value can be done at a higher speed, a higher reference frequency can be set.

Since the memory stores calculation algorithm by $\Sigma\Delta$ (sigma-delta) modulation, no arithmetic circuit is needed.

A frequency synthesizer can be provided that can obtain an output frequency with finer frequency resolution than a reference frequency.

BRIEF DESCRIPTION OF THE DRAWINGS

FIG. 3A is a diagram for illustrating how an address of ROM data is selected and the data is converted based on a number of clocks and a numerator portion input L.

FIG. 3B is a diagram for illustrating how an address of ROM data is selected and the data is converted based on a number of clocks and a numerator portion input L.

FIG. 3C is a diagram for illustrating how an address of ROM data is selected and the data is converted based on a number of clocks and a numerator portion input L.

FIG. 5A is a diagram for illustrating how an integer portion is added by making large a variable scope of a fraction value of a fraction portion.

FIG. 5B is a diagram for illustrating how an integer portion is added by making large a variable scope of a fraction value of a fraction portion.

DETAILED DESCRIPTION OF THE INVENTION

Figure 1:
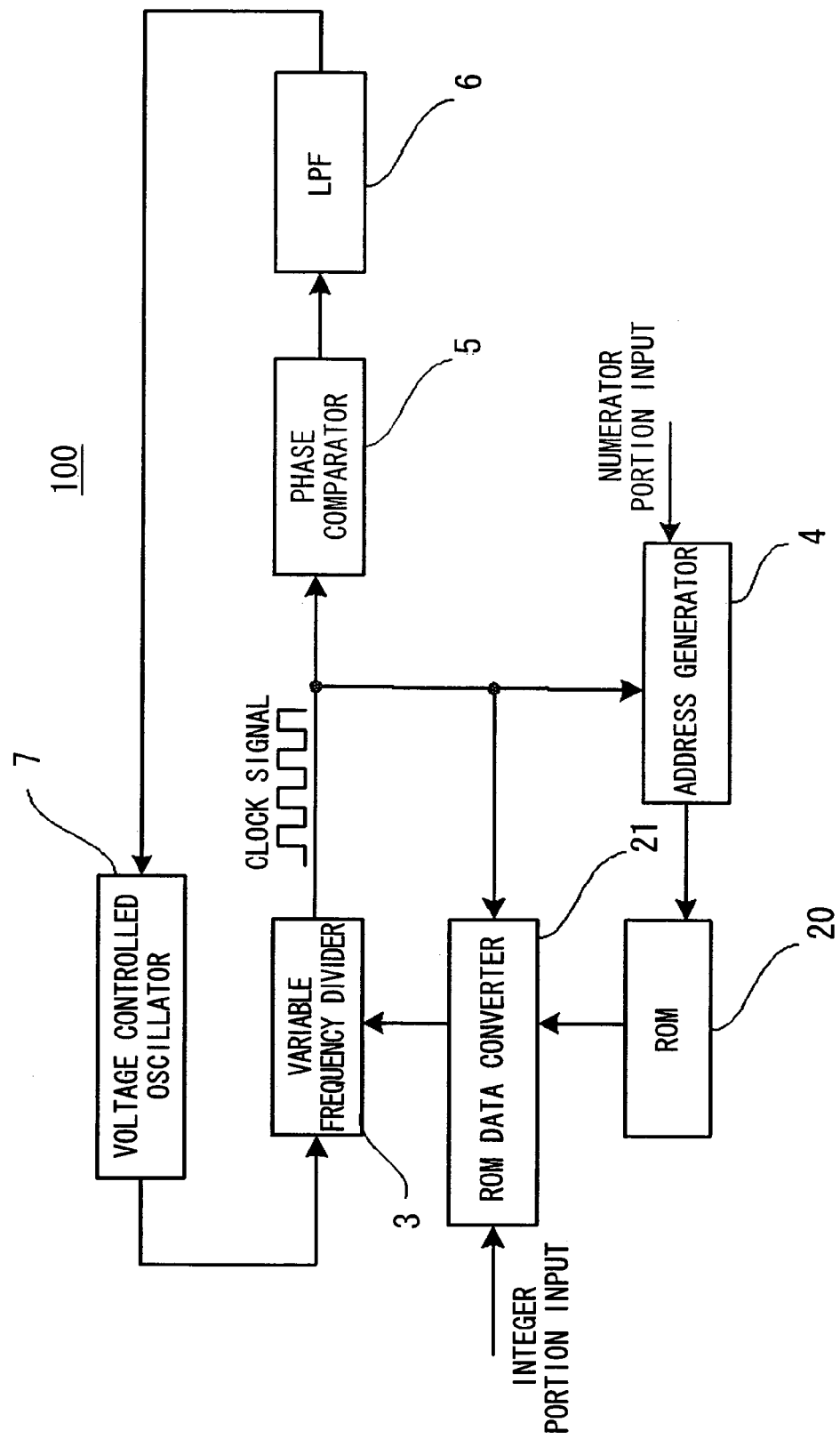
FIG. 1 is a block diagram for illustrating an embodiment of a phase locked loop in accordance with the invention.
Figure 6:
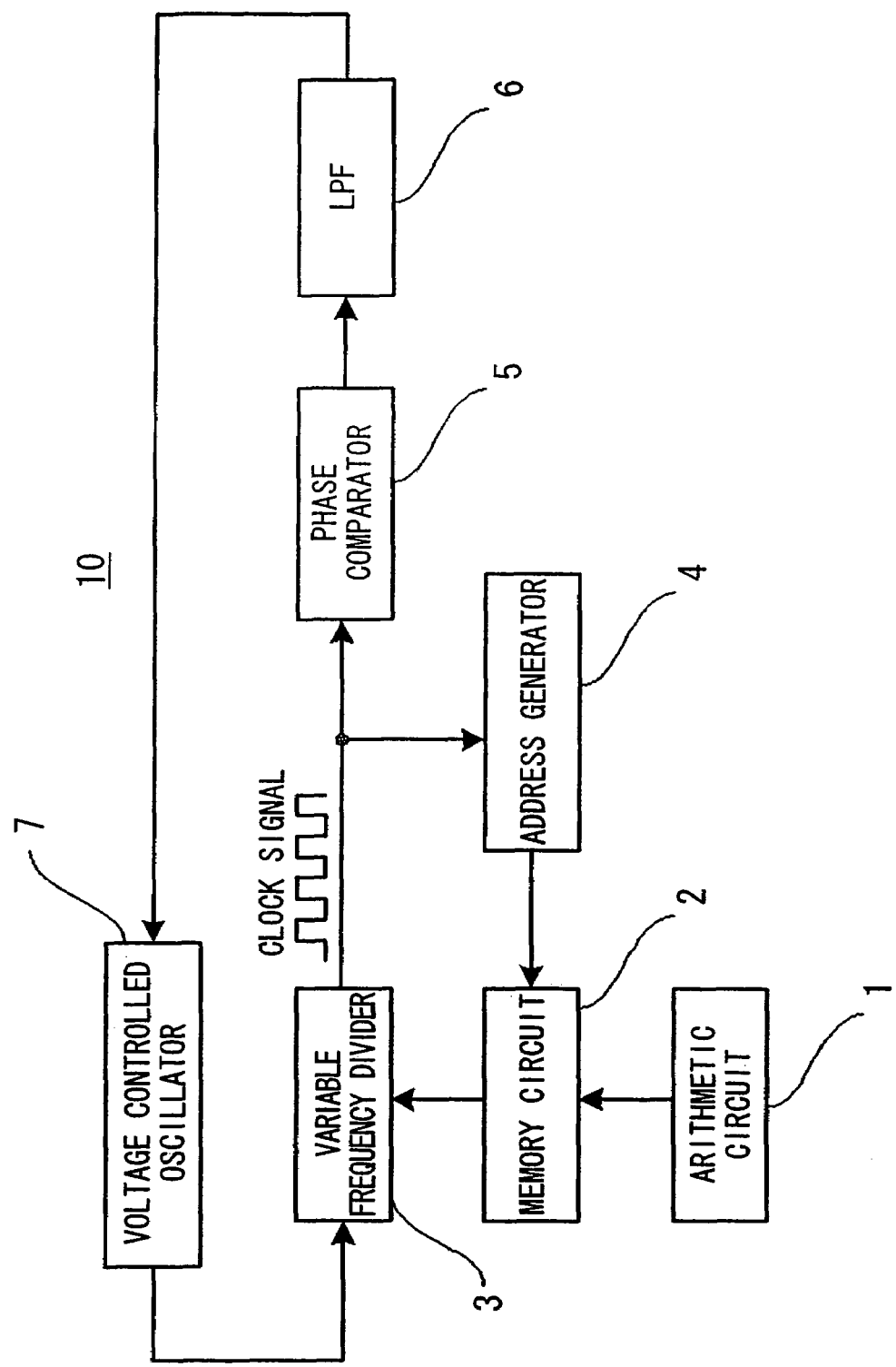
FIG. 6 is a block diagram for illustrating an example of a phase locked loop of the prior art.

Referring to the figures, embodiments in accordance with the invention will be described below. FIG. 1 is a block diagram for illustrating an embodiment of a phase locked loop in accordance with the invention. The elements in FIG. 1 that are identical to those of the prior art in FIG. 6 have the same reference numerals, and an explanation of the elements are omitted.

In FIG. 1, a phase locked loop 100 contains a variable frequency divider 3, an address generator 4, a phase comparator 5, a LPF 6, a voltage controlled oscillator 7, a ROM (a memory unit) 20, and a ROM data converter 21. The ROM 20, when a dividing value consists of an integer portion and a fraction portion, stores only the fraction portion. The fraction portion is expressed as the fraction portion=L/A, where L is a numerator of the fraction portion and A is a denominator of the fraction portion. The ROM data converter 21 adds an integer portion from an integer portion input to the fraction portion from the ROM 20. The denominator A is determined by resolution needed for the fraction frequency division, which is, for example, a numerical value such as 10, 64, and 99, and is read out from the ROM 20.

The operation of FIG. 1 is described below. First, the operation of the address generator 4 is explained. The address generator 4 receives a signal from the variable frequency divider 3 and a numerator portion input from an input unit (not shown). Based on these signals, the address generator 4 specifies an address of the ROM 20. It is described below how the address generator 4 specifies an address of the ROM 20.

The address generator 4 counts the clock signal from the variable frequency divider 3. The number of counted clocks is added to a value of the numerator portion input, whose value is designated as a read-out address of the ROM 20. For example, when the value "100" of the numerator portion input is input, the address generator 4 counts addresses in order from "100."

When the clocks are counted from "0" to "99", addresses "100", "101", "102", . . . , and "199" are counted, whose values are specified as read-out addresses of the ROM 20. When the clocks are counted in excess of "99", the address proceeds to "100", that is, returns to an initial address.

When "200" of the numerator portion input is input, the counting "200", "201", "202", . . . , and "299" is performed in order from 200, whose values become read-out addresses of the ROM 20. When the clocks are counted in excess of "99", the address returns to "200". The values to be input to the numerator portion input may be designated by a plurality of in-line package switches (not shown), or may be specified with respect to software by connecting the numerator portion input to a device (not shown).

Figure 2:
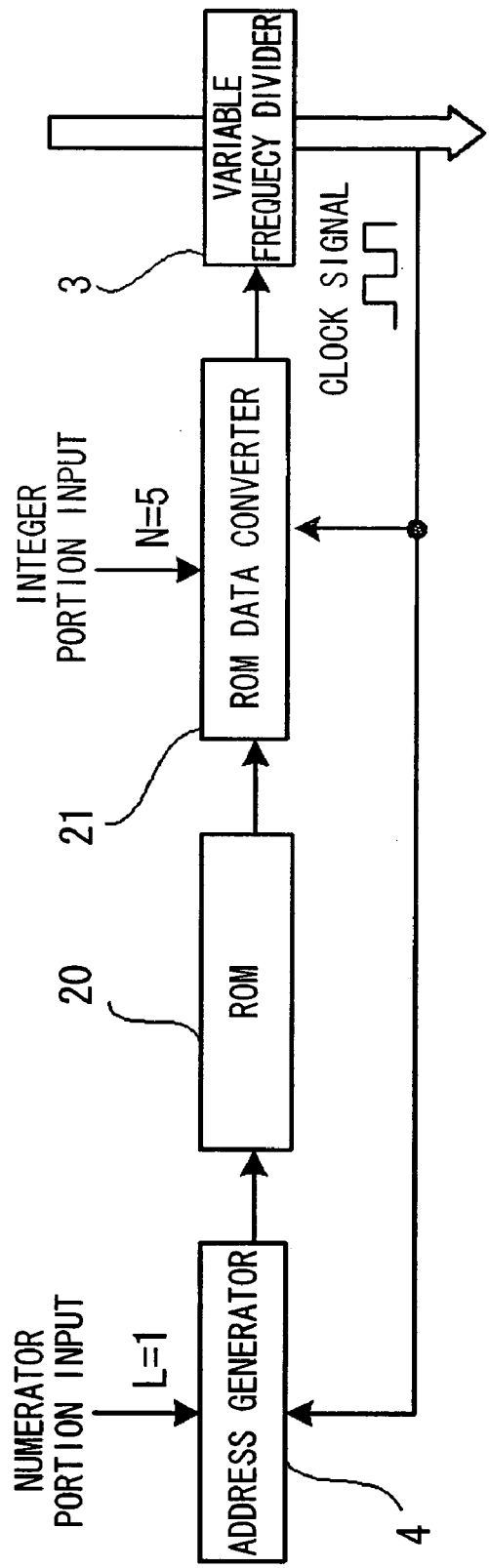
FIG. 2 is a block diagram for illustrating an operation of a ROM data converter 21 of a phase locked loop in accordance with the invention.

Referring to FIGS. 2 and 3, the function of the ROM 20, whose addresses are specified in this way, is described. One case for explanation is taken as an example where the numerator portion input="1", number of counted clocks = "1", and A=10. Since A=10, the ROM 20 has the values of numerator portion=L/A=0/10~9/10 stored therein.

As shown in FIG. 2, when L=1 is input from the numerator portion input, the address generator 4 generates the addresses based on the L and the clocks from the variable frequency divider 3 and designates the data of the ROM 20 as shown in FIG. 3A. In this case, since L=1, the second line from the top is selected. The ROM 20 outputs the data thereof selected in this way to the ROM data converter 21 as shown in FIG. 3B.

The ROM data converter 21 adds the integer portion to the fraction portion from the ROM 20. Under the situation, since N=5 of the integer portion input is input, the value 5 is added to every data as shown in FIG. 3C. The addition is realized by using hardware (not shown) such as a general type of adder. The dividing value derived in this manner is expressed as:

$$\text{Dividing value} = (5+5+5+5+5+5+5+5+5+6)/10$$
$$= 5 + 1/10$$

Figure 4:
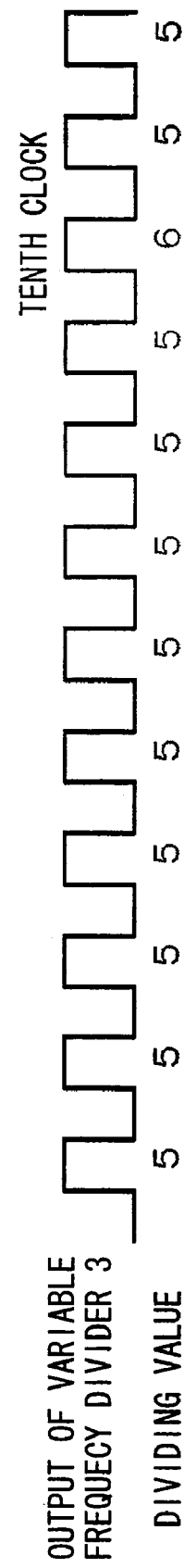
FIG. 4 is a diagram for illustrating how a dividing value is output according to the clocks from a variable frequency divider 3.

Accordingly, the dividing value is expressed by a form of the dividing value=N+L/A, as in a dividing value of a general type of fraction frequency divider. This dividing value, as shown in FIG. 4, is output corresponding to the clock signal from the variable frequency divider 3. In this example, since the number of the counted clocks is "1" and N is 5, dividing value 6 is output synchronized with the tenth clock signal.

Thus, the variable frequency divider 3 provides the clock signal to the phase comparator 5 based on the dividing value from the ROM data converter 21. The operation afterwards is the same as that of the prior art shown in FIG. 6.

In this way, since only the data of the fraction portion is stored and data-converted, the dividing value can be obtained based on a simple calculation without storing the integer portion of the dividing value. This allows the capacity of the ROM 20 to be small.

Referring to FIG. 5, an explanation will be given about how the dividing value can be set making use of calculation algorithm by the ΣΔ (sigma-delta) modulation. FIGS. 5A and 5B are a diagram for illustrating how an integer portion is added by making large a variable scope of a fraction value of a fraction portion.

The dividing values of FIG. 5A are as follows: maximum 2; minimum −3; and average 0.3. These values are the ones for noise-shaping using the calculation algorithm by the ΣΔ (sigma-delta) modulation.

FIG. 5B shows a drawing where integer portion N is added to the dividing values based on the ΣΔ (sigma-delta) modulation. That is, only adding the integer portion N=5 to each data, the average dividing value increases the average dividing value by the value of the integer portion. The average dividing value is 5.3.

The embodiments in accordance with the invention use a frequency synthesizer as an example of the phase locked loop. However, the invention is not limited to the frequency synthesizer.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A phase locked loop comprising:
a variable frequency divider for performing a fraction frequency division by switching a dividing value having an integer portion and a fraction portion;
a memory for storing the fraction portion; and
a data converter for adding the integer portion to the fraction portion from the memory based on a clock signal from the variable frequency divider to determine the dividing value to be supplied to the variable frequency divider,
wherein the memory has a read-out address designated therein based on a numerator portion input of the fraction portion and the clock signal.

2. A phase locked loop comprising:
a variable frequency divider for performing a fraction frequency division by switching a dividing value having an integer portion and a fraction portion;
a memory for storing the fraction portion; and
a data converter for adding the integer portion to the fraction portion from the memory based on a clock signal from the variable frequency divider to determine the dividing value to be supplied to the variable frequency divider,
wherein the memory stores the dividing value calculated based on calculation algorithm by ΣΔ (sigma-delta) modulation.

3. A phase locked loop comprising:
a variable frequency divider for performing a fraction frequency division by switching a dividing value having an integer portion and a fraction portion;
a memory for storing the fraction portion; and
a data converter for adding the integer portion to the fraction portion from the memory based on a clock signal from the variable frequency divider to determine the dividing value to be supplied to the variable frequency divider,
further comprising an address generator for specifying an address of the memory by the numerator portion input of the fraction portion and the clock signal.

4. The phase locked loop as recited in claim 1, wherein the phase locked loop is applied to a frequency synthesizer.

5. The phase locked loop as recited in claim 2, wherein the phase locked loop is applied to a frequency synthesizer.

6. The phase locked loop as recited in claim 3, wherein the phase locked loop is applied to a frequency synthesizer.

7. A method of performing a fraction frequency division of a variable frequency divider of a phase locked loop, the method comprising:
switching a dividing value having an integer portion and a fraction portion;
storing the fraction portion in a memory; and
adding the integer portion to the fraction portion from the memory based on a clock signal from the variable frequency divider to determine the dividing value to be supplied to the variable frequency divider, wherein the fraction portion is stored based on a numerator portion of the fraction portion and the clock signal.

8. The method as recited in claim 7, wherein the phase locked loop is applied to a frequency synthesizer.

9. A method of performing a fraction frequency division of a variable frequency divider of a phase locked loop, the method comprising:
switching a dividing value having an integer portion and a fraction portion;
storing the fraction portion in a memory; and
adding the integer portion to the fraction portion from the memory based on a clock signal from the variable frequency divider to determine the dividing value to be supplied to the variable frequency divider, wherein the dividing value is calculated based on calculation algorithm by ΣΔ (sigma-delta) modulation.

10. The method as recited in claim 9, wherein the phase locked loop is applied to a frequency synthesizer.

11. A method of performing a fraction frequency division of a variable frequency divider of a phase locked loop, the method comprising:
switching a dividing value having an integer portion and a fraction portion;
specifying an address of a memory based on a numerator portion of the fraction portion and the clock signal;
storing the fraction portion at the address; and
adding the integer portion to the fraction portion from the memory based on a clock signal from the variable frequency divider to determine the dividing value to be supplied to the variable frequency divider.

12. The method as recited in claim 11, wherein the phase locked loop is applied to a frequency synthesizer.

* * * * *